United States Patent [19]

Okikawa

[11] Patent Number: 4,564,734
[45] Date of Patent: Jan. 14, 1986

[54] WIRE BONDER
[75] Inventor: Susumu Okikawa, Ohme, Japan
[73] Assignee: Hitachi, Ltd., Tokyo, Japan
[21] Appl. No.: 476,268
[22] Filed: Mar. 17, 1983
[30] Foreign Application Priority Data Mar. 31, 1982 [JP] Japan .................................. 57-51237

[51] Int. Cl.$^4$ ............................................. B23K 31/00
[52] U.S. Cl. .................................. 219/56.22; 219/56.1
[58] Field of Search ...................... 219/56, 56.1, 56.21, 219/56.22

[56] References Cited

U.S. PATENT DOCUMENTS

| 4,098,447 | 7/1978 | Edson et al. | 219/68 X |
| 4,387,283 | 7/1983 | Peterson et al. | 219/56.21 |
| 4,388,512 | 7/1983 | Salzer et al. | 219/56.22 |
| 4,390,771 | 7/1983 | Kurtz et al. | 219/56.22 |
| 4,476,365 | 10/1984 | Kurtz et al. | 219/56.22 |

Primary Examiner—C. L. Albritton
Assistant Examiner—Catherine M. Sigda
Attorney, Agent, or Firm—Antonelli, Terry & Wands

[57] ABSTRACT

A wire bonder useful for assembling electronic components with fine metallic wire. The wire bonder in accordance with this invention forms a ball at a free end of a bonding wire by utilizing discharge arc and thereafter bonds the ball to a component. The wire bonder of the invention has a construction in which the atmosphere between the tip of the bonding wire and a discharge electrode disposed adjacent the tip of the bonding wire can be maintained as a reducing gas atmosphere. Especially when an aluminum wire, which is an easily oxidizable thin metallic wire, is used as the bonding wire, the wire bonder of the present invention improves the sphericity of the ball formed by discharge arc as well as the bondability.

31 Claims, 9 Drawing Figures

WIRE BONDER

BACKGROUND OF THE INVENTION

This invention relates to a wire bonder. More particularly, the present invention relates to a wire bonder which makes it possible to bond a thin wire of an easily oxidizable metal such as an aluminum wire, an aluminum alloy wire or the like by thermo-compression bonding.

A wire bonding step is one of the fabrication steps of a semiconductor device and is practised in order to electrically connect an electrode pad of an element pellet to a lead as an external conductor by use of a wire. At present, thermo-compression bonding using a gold wire (Au wire) and ultrasonic wire bonding using an aluminum wire (Al wire) have been used widely. Thermo-compression bonding of the Au wire is referred to as "nail head bonding". According to this technique, the tip of the Au wire which consists of an oxidation-resistant metal is heat-fused by a hydrogen torch or discharge arc to form a gold ball and this gold ball is compression-bonded while being pushed to a bonding portion using a wire connecting tool such as a capillary. This technique has the advantages that strong bond can be formed and the directivity of the wire bonding does not exist. The technique has the disadvantages that a so-called "purple plaque phenomenon" is formed (purple $AuAl_2$ compound is produced when an Au-Al system is heated to 300° C. or above) to reduce the bonding strength when the bonding portion is made of an aluminum material such as an electrode pad. Further gold itself is a precious metal which is subject to change in market price.

On the other hand, ultrasonic bonding using the Al wire fixes the Al wire by ultrasonic oscillation. This technique has the advantage that it can be practised economically because the aluminum wire is inexpensive. However, the construction of a wire bonder is complicated because wire bonding is effected by ultrasonic oscillation and because the directivity of wire bonding exists. Bonding speed is lower than the thermo-compression bonding.

Accordingly, in order to make the most of the advantages of both thermo-compression bonding and ultrasonic bonding techniques, a thermo-compression bonding technique using aluminum has been attempted in recent years. The advantages produced by this technique are that the bonding wire material, that is, aluminum, is inexpensive, no directivity exists in wire bonding, the wire bonder is simple in construction and the bonding speed is high. This technique is the so-called nail head bonding technique which forms a ball at the tip of the Al wire. If the conventional wire bonder using the Au wire and the hydrogen torch or discharge arc is applied to this technique, however, the ball can not be formed satisfactorily at the tip of the Al wire because aluminum is an easily oxidizable metal and the resulting oxide of aluminum exerts adverse influences. Thus, it has been found that wire bonding can not be carried out with high reliability in accordance with this technique.

An example of the conventional wire bonder of the thermo-compressing bonding system which uses the Al wire and forms a ball at the tip of the Al wire by discharge arc is disclosed in Japanese Patent Application No. 54834/1976 (Japanese Patent Laid-Open No. 147174/1976). As shown in FIG. 1, this wire bonder applies a potential across the Al wire 1 and a discharge electrode 2 from a high voltage source 3 while a negative potential is being applied to the Al wire to cause discharge arc between them while the tip of the Al wire is kept in the atmosphere of an inert gas such as argon (Ar) which causes the formation of the ball at the tip of the Al wire. However, the sphericity of the resulting ball is low and a constriction is formed at the neck of the Al wire immediately above the ball. It has been found that if wire bonding is performed under such conditions, the sphericity of the ball that has been compression-bonded is low, bonding to the correct position becomes difficult and the wire is likely to be broken from the constriction, reducing the reliability of bonding.

As a result of studies and analyses, the reasons why the sphericity of the ball of the Al wire is low and why the constriction occurs are that the aluminum oxide, i.e., alumina ($Al_2O_3$), formed on the surface of the Al wire prevents the fusing of the Al wire and the formation of the ball and that discharge arc expands in the proximity of the tip of the Al wire, thereby causing energy dispersion.

SUMMARY OF THE INVENTION

In a wire bonder of the type which is constructed so as to generate a discharge arc between a bonding wire made of an easily oxidizable metal such as Al or Al alloy and a discharge electrode, the present invention eliminates the adverse influences of an oxide on the surface of a metallic bonding wire and forms a ball having a good spherical shape at a free end of the bonding wire.

It is an object of the present invention to provide a wire bonder which can form a ball having high sphericity and can eliminate the occurrence of constriction of the bonding wire in the proximity of the ball by optimizing the atmospheric gas at the time of discharge between the bonding wire and a discharge electrode and by suitably setting the polarities between them.

The present invention can best be understood from the following description to be taken in conjunction with the accompanying illustrative drawings.

DESCRIPTION OF THE PREFERRED EMBODIMENTS

Figure 2:
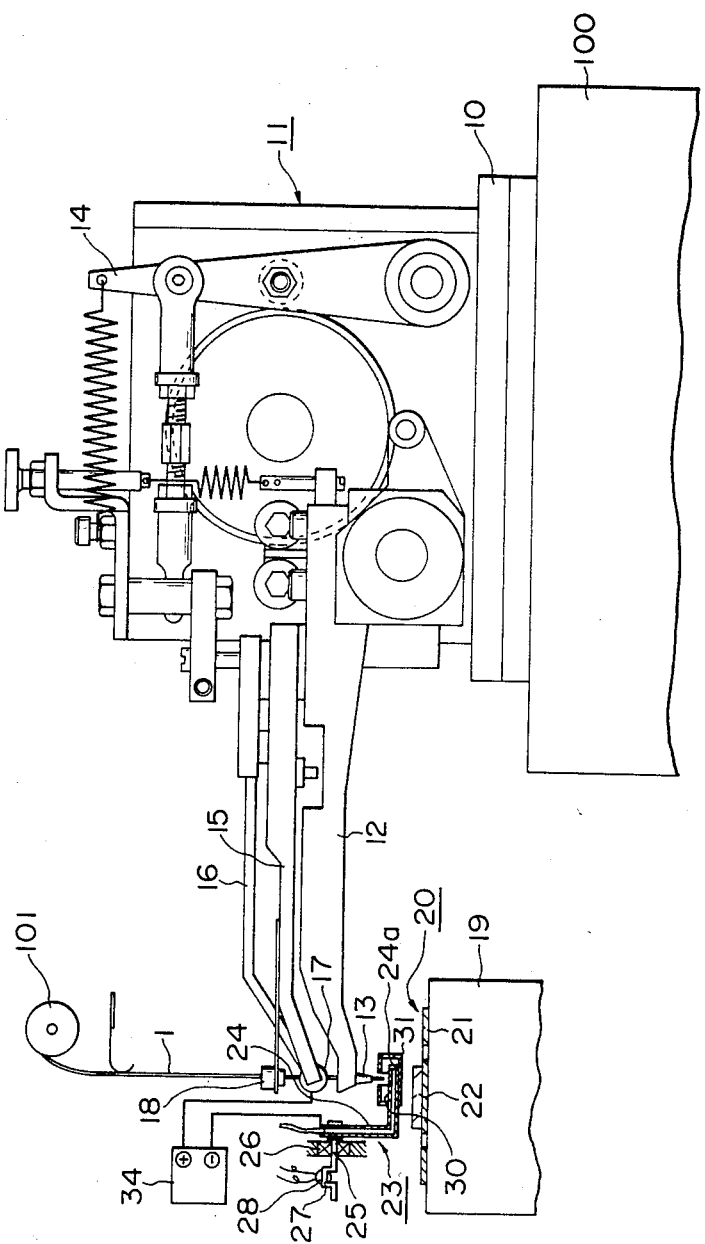
FIG. 2 is a front view showing the wire bonder in accordance with one embodiment of the present invention.

FIG. 2 is a front view showing the wire bonder in accordance with one embodiment of the present invention. In the drawing, the base end of a bonding arm 12 is pivotally supported by a bonding head 11 which is mounted on an XY table 10 placed on a base 100 of the wire bonder. A capillary 13 as a wire connecting tool is fixed to the tip of the bonding arm 12, which tip can swing up and down by a cam mechanism. A pair of clamper arms 15, 16 actuated by a cam driving member 14 or an electromagnetic solenoid are disposed above the bonding arm 12 so that the tips of these arms 15, 16 are positioned immediately above the capillary 13 to form a clamper 17. Reference numeral 1 represents an Al wire as the bonding wire. The Al wire is taken out from a spool 101, is inserted through a guide 18 and is then inserted into the capillary 13 through the clamper 17. Besides the Al wire which is not limitative, the bonding wire may be a wire consisting of an easily oxidizable metal such as aluminum alloys exemplified by aluminum containing a small amount of silicon (Si) or aluminum containing a small amount of nickel (Ni).

On the other hand, reference numeral 19 represents a bonding stage. A lead frame 20 to which a semiconductor pellet as the object of bonding is die-bonded is placed on the bonding stage 19. The Al wire 1 is connected between the lead frame 21 and the semiconductor element pellet 22 as the capillary 13 moves up and down.

Figure 3:
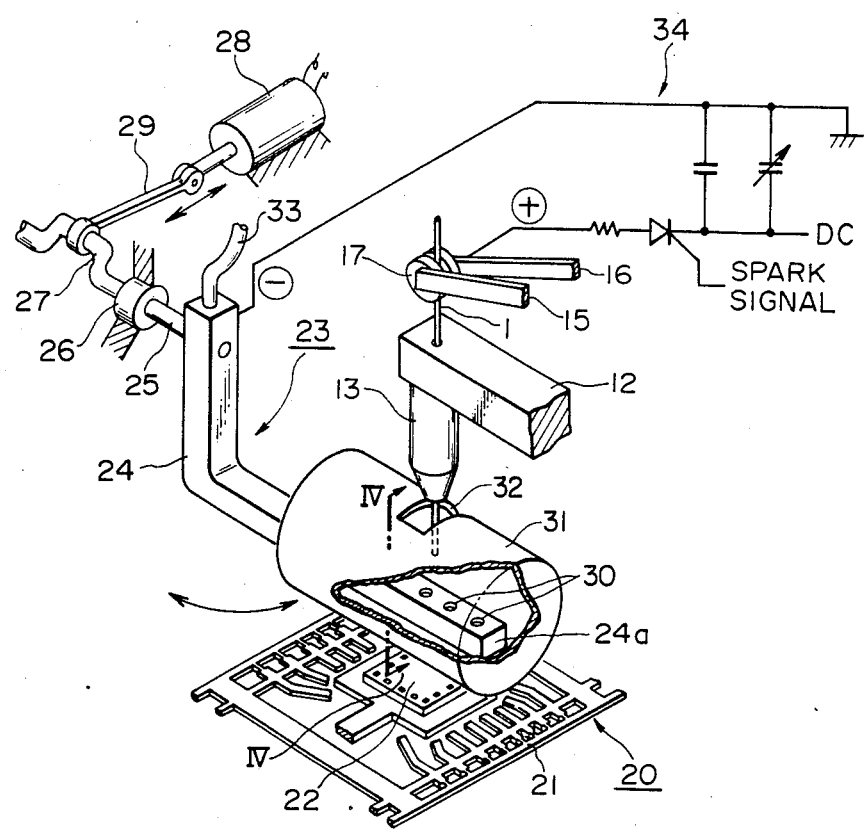
FIG. 3 is an enlarged perspective view showing the principal portions of the wire bonder shown in FIG. 2.
Figure 4:
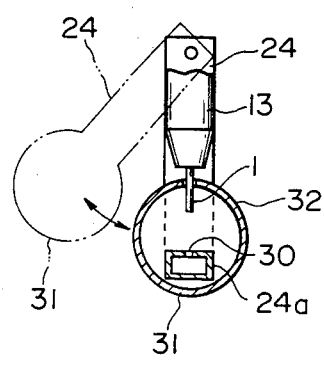
FIG. 4 is a sectional view taken along line IV—IV of FIG. 3.

Reference numeral 23 represents a discharge electrode portion consisting of an electric conductor. The electrode portion 23 constitutes an important feature of the present invention. This is disposed independently in the proximity of the capillary 13. As shown in FIG. 3 in cooperation with FIG. 4, the discharge electrode portion 23 has a substantially L-shaped hollow electrode 24. A pivot 25 integrally formed at the upper end portion of this discharge electrode portion 23 is pivotally supported by a bearing 26 of the wire bonder fixing portion so that the electrode 24 as a whole can reciprocate in the direction indicated by an arrow in the drawing, and the lower side portion 24a of the electrode 24 can move below the capillary 13, that is, between the position immediately below the tip of the Al wire 1 and the sideway position (retreating position) of the capillary 13. In this case, if a crank 27 is formed at a part of the pivot 25 and is connected to an electromagnetic solenoid 28 by a connecting rod 29, reciprocation of the solenoid 28 produces the reciprocating swing of the electrode 24 described above.

A plurality of through-holes 30 are bored on the upper surface of the lower side portion 24a of the electrode 24 so as to communicate with the inner hollow portion of the electrode 24, and a cylindrical cover 31 is fitted in such a manner as to encompass the lower side portion 24a. A notch 32 extending over substantially about ¼ of the circumference is defined at an upper part of this cover 31 so that when the electrode 24 moves down, the tip of the Al wire 1 can penetrate into the cover 31 through this notch 32. On the other hand, a tube 33 communicating with the inner hollow portion of the electrode 24 is disposed at the base end of the electrode 24 so as to continue the latter and gas is thereafter supplied into the electrode 24 through this tube 33. A power source circuit 34 such as shown in the drawing is connected between the electrode 24 and the clamper 17 so that the clamper 17, that is, the Al wire 1 connected to the clamper 17, serves as the positive plate while the electrode 24 serves as the negative plate. A discharge arc is generated from the electrode 24 towards the Al wire 1.

This embodiment uses a reducing gas prepared by diluting hydrogen ($H_2$), carbon monoxide (CO), dinitrogen oxide ($N_2O$) or methane ($CH_4$) with an inert gas (argon or nitrogen gas) as the gas supplied through tube 33. The gas is jetted into the cover 31 through the through-holes 30 on the side portion 24a of the electrode 24 so as to keep the inside of the cover, that is, between the electrode 24 and the Al wire 1, in the reducing gas atmosphere.

In the construction described above, when the electromagnetic solenoid 28 operates and its shaft swings the crank 24 as well as the pivot 25 by its contracting and extending motion, the side portion 24a of the electrode 24 rocks downward and is positioned immediately below the Al wire 1, thereby causing the tip of the Al wire 1 to penetrate into the cover 31. The inside of the cover 31, that is, the portion between the Al wire 1 and the electrode 24, is then held in the reducing gas atmosphere by the reducing gas that is jetted from a plurality of through-holes 30 through the inner hollow of the electrode 24. Thereafter, when the power source circuit 34 is turned on, a discharge arc is generated between the Al wire 1 and the electrode 24 and the free end of the Al wire 1 is fused by the arc energy to form the ball. In this case, since the ball formation of the Al wire 1 is effected in the reducing gas atmosphere in this embodiment, alumina as the oxide of aluminum formed on the Al wire surface is reduced to aluminum. Since fusing is effected under this state, both the inside and the surface of the tip of the Al wire are uniformly fused as a whole. For this reason, uniform surface tension develops and forms a ball having high sphericity.

In this embodiment, the Al wire as the bonding wire is used as the positive plate and the discharge electrode, as the negative plate. Accordingly, the discharge arc in this instance is generated from the electrode 24 towards the Al wire 1 due to the polarities of the Al wire and electrode. Hence, a so-called "cleaning phenomenon" (in which arc travels while searching for the fresh oxide film on the Al wire surface and occurs from the Al wire tip over a wide range in the proximity of the tip) does not occur, so that thermal influence is not exerted on portions other than the ball-forming position of the Al wire. Only the free end of the Al wire is locally heat-fused, forming the Al ball having high sphericity. Moreover, since this is a localized heating system, no constriction is formed immediately above the ball.

After the ball is formed, the pivot 25 and the electrode 24 are rocked upward by the operation of the electromagnetic solenoid 28 and the retracting operation of its shaft and the electrode side portion 24a is moved back from the position immediately below the Al wire 1. Accordingly, when the capillary 13 is moved down with rocking of the bonding arm 12, the Al wire 1 can be bonded to the pellet 22 of the object wire bonding member 20. Because the ball thus formed has high sphericity, wire bonding can be effected with high reliability.

Next, another embodiment of the present invention will be described. This embodiment is characterized in that an inert gas having a thermal pinch operation is used as the gas to be supplied into the electrode 24 in addition to the reducing gas used in the foregoing embodiment. Examples of the gas having such a thermal pinch operation are hydrogen ($H_2$), helium (He), methane ($CH_4$), nitrogen ($N_2$), carbon monoxide (CO) and the like. If this gas is present between the Al wire 1 and the electrode 24, a so-called "thermal pinch action" is obtained in which the discharge arc concentrates upon the tip of the Al wire so that the discharge energy concentrates upon the tip of the Al wire and is effectively used for the formation of the ball, thereby improving the sphericity of the ball and accomplishing energy saving. This thermal pinch action occurs irrespective of the polarity of the power source to be applied to the Al wire, that is, whether or not the polarity is positive or negative. Accordingly, the power source circuit 34 is not limited to the one shown in the drawing. If hydrogen ($H_2$), carbon monoxide (CO) or methane ($CH_4$) is used as the gas, the single gas provides both actions because $H_2$, CO and $CH_4$ have both reducing action and thermal pinch action.

Figure 5:
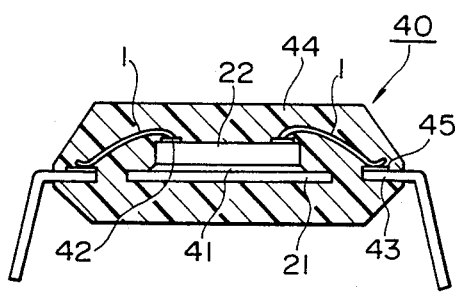
FIG. 5 is a sectional view showing a semiconductor device which is wire-bonded by use of the wire bonder in accordance with the present invention.

FIG. 5 illustrates an example of the semiconductor device fabricated in the manner described above. In this semiconductor device 40, the pellet 22 is fixed on the lead frame 21 by Au-Si eutectic crystal 41 of the like and the pad 42 of the pellet 22 and the inner mold 43 of the lead frame 21 are connected to each other by the Al wire 1. Thereafter, mold-sealing is effected using a resin 44. The Al wire 1 is bonded after the ball is formed in the manner described above. In this case, it is possible to use an aluminum alloy material consisting principally of aluminum and containing about 1% by weight of silicon (Si) or an aluminum alloy consisting principally of aluminum and containing about 0.5% by weight of nickel (Ni) in place of the aluminum wire 1.

If aluminum or the aluminum alloy consisting of aluminum as the principal conponent is used as the bonding wire, the wire surface is easily oxidizable. However, a ball having high sphericity can be formed if the ball is formed at the top of the bonding wire in the atmosphere of the reducing gas or the gas having the thermal pinch effect in accordance with the present invention. If the gas described above, especially the hydrogen gas, is used, the ball portion at the tip of the bonding wire and in its proximity becomes microscopically porous but this does not exert adverse influences upon various properties such as bondability during wire bonding.

To improve connection between the Al wire 1 and the inner lead 43, a silver (Ag) or gold (Au) plating layer 45 is formed on the surface of the inner lead 43.

The semiconductor device of the kind described above can be produced economically because the Al wire is used in place of the Au wire. Since the bonding method is employed, no bonding directivity exists and the construction of the wire bonder (especially the construction of the bonding stage and bonding head) can be simplified. The bonding method can improve the bonding speed in comparison with the ultrasonic wire bonding method. As the sphericity of the ball is improved, reliability of wire bonding can also be improved.

Figure 1:
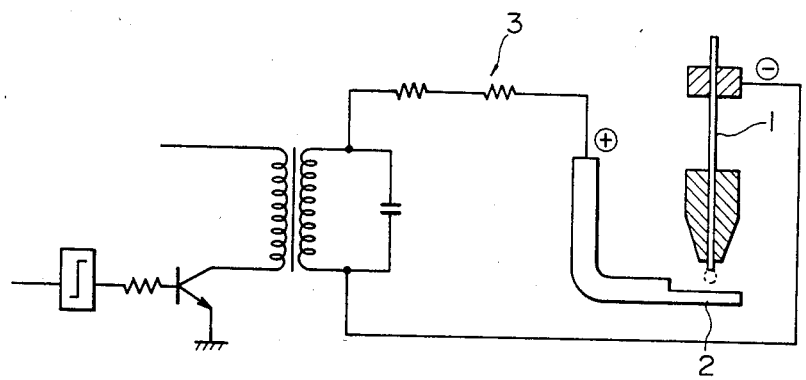
FIG. 1 is a schematic view showing the construction of the conventional wire bonder.
Figure 8:
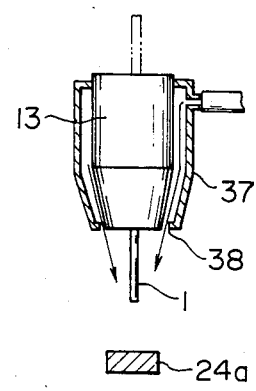
FIG. 8 is a sectional front view showing still another embodiment of the present invention.
Figure 6:
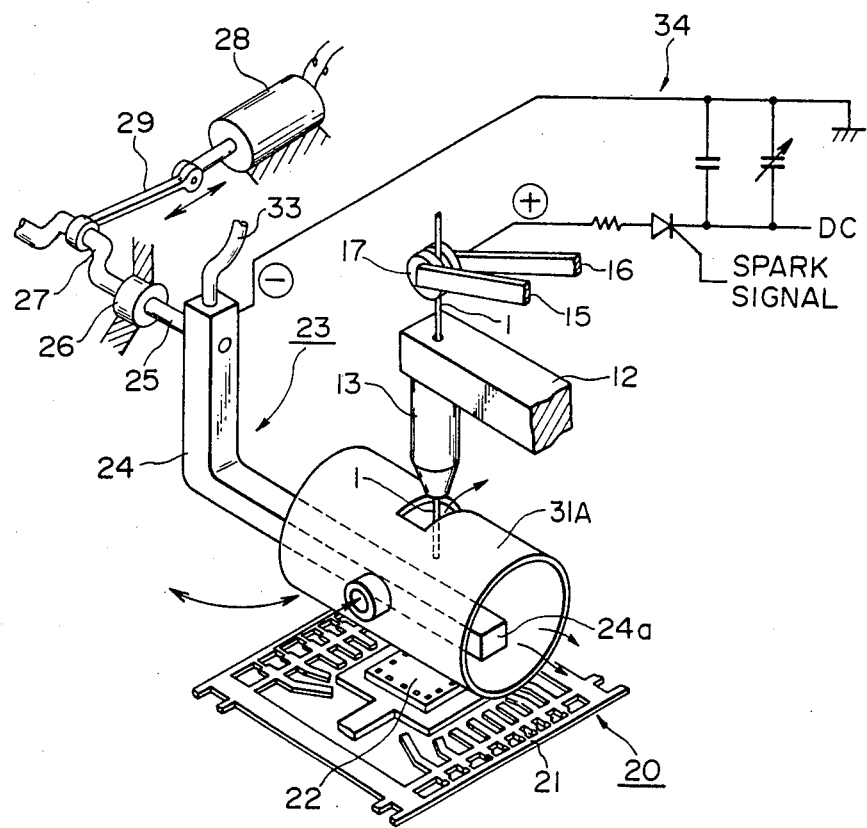
FIGS. 6 and 7 are perspective views, each showing another embodiment of the present invention.
Figure 7:
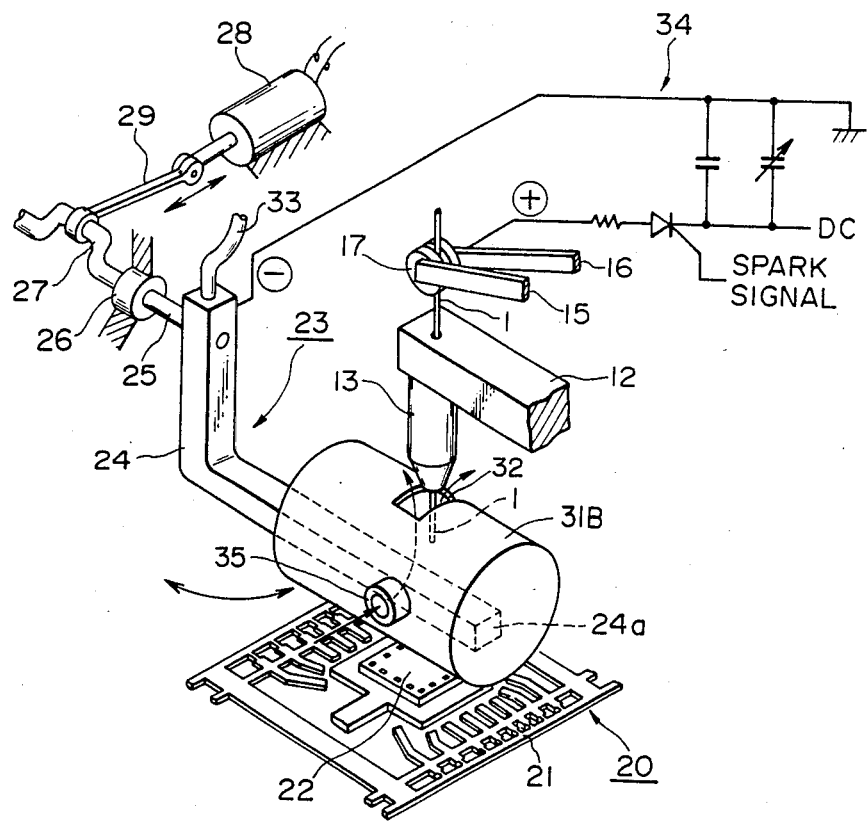

The construction of the electrode portion 23 of FIG. 1 may be used in the apparatus of FIGS. 6 through 8. The construction shown in FIG. 6 opens one end of the cover 31A to be fitted to the lower side portion 24a of the electrode 24 and forms a gas feed port 35 at a part of the cover 31A so as to fully charge the gas into the cover 31A through this feed port 35 which blows the gas to the tip of the Al wire 1. The construction shown in FIG. 7 is analogous to the one shown in FIG. 3 in that both ends of the cover 31B are closed, but the gas feed port 35 is directly formed on the cover 31B so that the gas can directly flow towards the notch 32 and is jetted in the proximity of the Al wire 1. The construction shown in FIG. 8 is entirely different from the foregoing constructions. In this construction, the cover 31 is integrally fitted around the outer circumference of the capillary 13 so that when the gas is supplied between the capillary 13 and the cover 37, the gas is blown downwards to the tip of the Al wire 1 from the lower end opening 38 of the cover 37.

These embodiments have in common that the tip of the Al wire is held in the predetermined gas atmosphere and the use of the reducing gas alone or the use of the mixed gas of the reducing gas and the gas having the thermal pinch action is suitably selected in accordance with the intended application.

Figure 9:
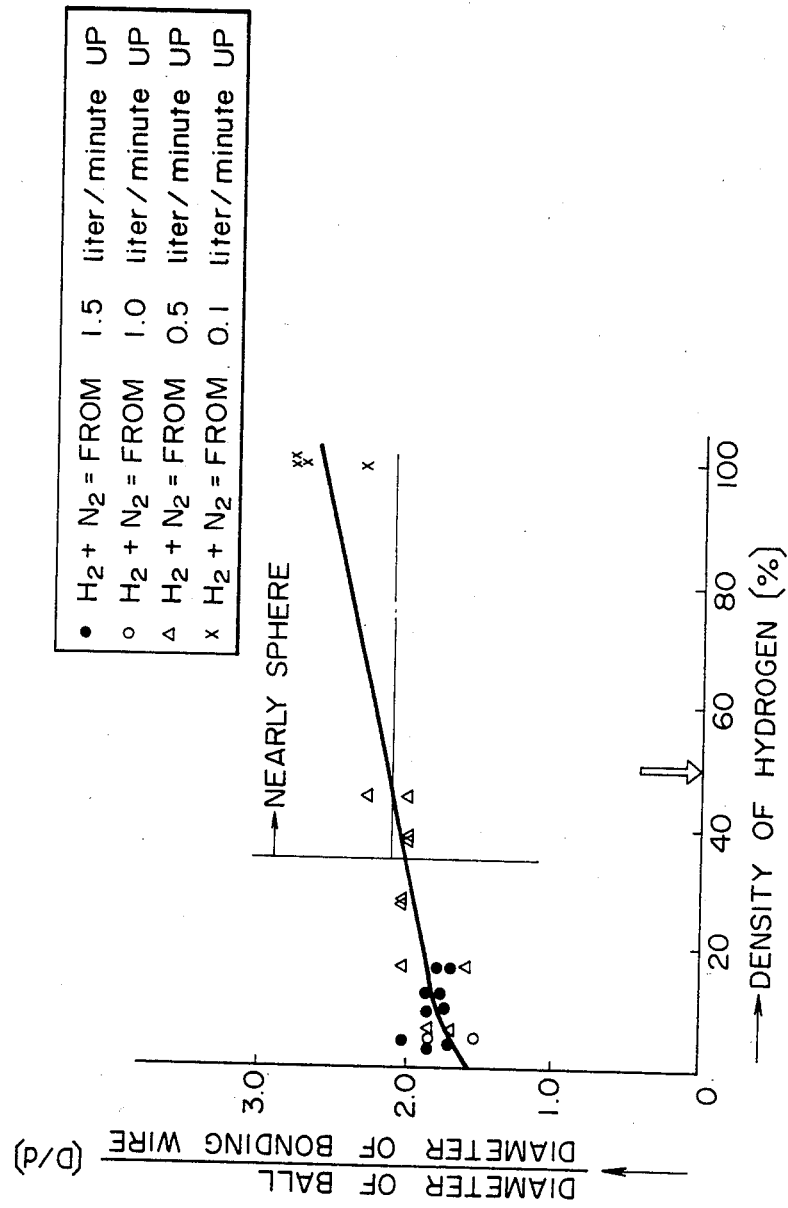
FIG. 9 is a diagram showing the relation between the hydrogen gas ($H_2$) density and the ball shape of the bonding wire.

The sphericity and size of the ball or the like are affected in the present invention by electric parameters such as the voltage, current and time of the discharge power source, mechanical parameters such as the distance between the Al wire and the electrode, and chemical parameters such as the gas density. It is essential that these parameters be appropriately selected in accordance with the required size of the ball and the like. FIG. 9 illustrates the change in the ball diameter/wire diameter as a function of the change in the hydrogen ($H_2$) density. This characteristic is represented by the hydrogen ($H_2$) density contained in the nitrogen ($N_2$) gas which is an inert gas. It can be seen that the higher the hydrogen density, the higher the sphericity of the ball becomes. Accordingly, the hydrogen ($H_2$) consumption quantity may be set to a density that provides a satisfactory ball in view of the cost.

As described above, in the wire bonder in accordance with the present invention, the atmosphere between the wire and the electrode and more specifically, the atmosphere at the tip of the wire, is held in the reducing atmosphere and discharge arc is generated between them. Furthermore, the tip of the wire is held in the atmosphere of the gas that causes the thermal pinch action. This arrangement improves the sphericity of the ball to be formed at the tip of the wire made of an easily oxidizable metal such as aluminum or aluminum alloy and prevents the occurrence of constriction. The sphericity as well as contriction can be further improved when the polarilities of the wire and electrode are appropriately taken into account and wire bonding reliability using the easily oxidizable metal such as aluminum or aluminum alloy can be further improved.

What is claimed is:

1. A wire bonder for forming a ball at a free tip of a bonding wire by electrical discharge between the tip and an electrode comprising:

a wire conveying tool by which the bonding wire is guided;

a wire clamper for clamping said bonding wire;

a discharge electrode assembly carrying said electrode which is rotatable between a first angular position in which said assembly is located at a position displaced away from the free tip and a second angular position in which said assembly is located adjacent said free tip at a position where said electrical discharge can occur, said assembly being rotatably mounted on a pivot point and having said electrode being joined to said assembly, said electrode having a cover defining a chamber with an open portion for permitting the cover to swing into a position to surround the tip of the free end of the wire when pivoted into the second angular position;

means for introducing a dry reducing gas atmosphere into said chamber chosen from the group consisting of $H_2$, CO, $N_2O$ or $CH_4$;

a power source for applying a potential of one polarity to said clamper and of an opposite polarity to said discharge electrode;

said wire being biased by said power supply at a positive potential and said electrode being biased by said power supply at a negative potential; and said means for introducing a gas atmosphere comprising an electrical conductor which is part of said discharge electrode and having a hollow portion with a plurality of holes communicating with said chamber to permit the gas atmosphere to be introduced into said chamber.

2. A wire bonder in accordance with claim 1 wherein said wire is chosen from the group consisting of Al or aluminum alloys.

3. A wire bonder in accordance with claim 1 further comprising means for bonding said ball to an electrical component after the formation of said ball.

4. A wire bonder in accordance with claim 1 wherein said atmosphere is non-oxidizing whereby oxidization of the wire is prevented by the atmosphere.

5. A method for forming a ball at the free tip of a metallic wire which forms an oxide that effects the sphericity of the ball when an electrical discharge between the tip and an electrode is used to form the ball comprising:

positioning the tip of the wire at a position displaced by a gap from the electrode across which a discharge can be produced by the application of an electrical potential of a magnitude sufficient to cause the discharge; and providing a dry reducing gas atmosphere prior to discharge chosen from the group $H_2$, CO, $N_2O$ or $CH_4$ which envelops the gap between the tip and the electrode at the time of the discharge between the tip and the electrode to form said ball.

6. A method for forming a ball at the free tip of a metallic wire in accordance with claim 5 wherein said reducing gas includes a gas which concentrates the discharge at the tip of the wire.

7. A method for forming a ball at the free tip of a metallic wire in accordance with claim 6 wherein said gas which concentrates the discharge is chosen from the group consisting of $H_2$, He, $CH_4$, $N_2$ or CO.

8. A method for forming a ball at the free tip of a metallic wire in accordance with claim 5 wherein said wire is an aluminum alloy.

9. A method for forming a ball at the free tip of a metallic wire in accordance with claim 5 wherein said wire is Al.

10. A method for forming a ball in accordance with claim 5 wherein said atmosphere is non-oxidizing whereby oxidization of the wire is prevented by the atmosphere.

11. A method in accordance with claim 6 wherein said atmosphere is non-oxidizing whereby oxidization of the wire is prevented by the atmosphere.

12. A method for forming a ball at the free tip of a metallic wire which forms an oxide that effects the sphericity of the ball when an electrical discharge between the tip and an electrode is used to form the ball comprising:

positioning the tip of the wire at a position displaced from the electrode by a gap across which a discharge can be produced by the application of an electrical potential of a magnitude sufficient to cause the discharge; and providing a reducing gas atmosphere prior to discharge which envelops the gap between the tip and the electrode chosen from the group $H_2$, CO, $N_2O$ or $CH_4$ at the time of the application of the electrical potential which causes the discharge with a positive polarity being applied to the tip and a negative polarity being applied to the electrode.

13. A method for forming a ball at the free tip of a metallic wire in accordance with claim 12 wherein said reducing gas includes a gas which concentrates the discharge at the tip of the wire.

14. A method for forming a ball at the free tip of a metallic wire in accordance with claim 13 wherein said gas which concentrates the discharge is chosen from the group consisting of $H_2$, He, $CH_4$, $N_2$ or CO.

15. A method for forming a ball at the free tip of a metallic wire in accordance with claim 12 wherein said wire is an aluminum alloy.

16. A method for forming a ball at the free tip of a metallic wire in accordance with claim 12 wherein said wire is Al.

17. A method for forming a ball in accordance with claim 12 wherein said atmosphere is non-oxidizing whereby oxidization of the wire is prevented by the atmosphere.

18. A method in accordance with claim 13 wherein said atmosphere is non-oxidizing whereby oxidization of the wire is prevented by the atmosphere.

19. A method in accordance with claim 14 wherein said atmosphere is non-oxidizing whereby oxidization is prevented by the atmosphere.

20. A method for forming a ball at the free tip of a metallic wire which forms an oxide that effects the sphericity of the ball when an electrical discharge between the tip and an electrode is used to form the ball comprising:

positioning the tip of the wire at a position displaced from the electrode by a gap across which a discharge can be produced by the application of an electrical potential of a magnitude sufficient to cause the discharge;

providing an atmosphere prior to discharge which envelopes the gap between the tip and the electrode at the time of the discharge between the tip and the electrode to form said ball, said atmosphere containing a reducing agent for said wire chosen from the group of gases consisting of $H_2$, CO, $N_2O$ or $CH_4$ and an arc concentrating agent chosen from the group of gases consisting of $H_2$, He, $CH_4$, $N_2$ or CO to concentrate the discharge at the tip of the wire.

21. A method for forming a ball at the free tip of a metallic wire in accordance with claim 20 wherein said wire is an aluminum alloy.

22. A method for forming a ball at the free tip of a metallic wire in accordance with claim 20 wherein said wire is Al.

23. A method for forming a ball in accordance with claim 20 wherein said electrical potential is applied with a positive bias to said wire and a negative bias to said electrode.

24. A method for forming a ball in accordance with claim 23 wherein said atmosphere prior to discharge is dry.

25. A method in accordance with claim 20 wherein said wire is fed axially to move said tip in position to form said ball; and said atmosphere is blown axially in a direction toward the tip.

26. A method in accordance with claim 2 wherein said electrical potential is applied with a positive potential to said wire and a negative potential to said electrode.

27. A method for forming a ball in accordance with claim 20 wherein said atmosphere is non-oxidizing whereby oxidization of the wire is prevented by the atmosphere.

28. A method for forming a ball in accordance with claim 24 wherein said atmosphere is non-oxidizing whereby oxidization of the wire is prevented by the atmosphere.

29. A method for forming a ball at the free tip of a metallic wire by an electrical discharge comprising:

positioning the tip of the wire at a position displaced from the electrode by a gap across which a discharge can be produced by the application of an electrical potential of a magnitude sufficient to cause the discharge; and providing a dry gas atmosphere prior to discharge which is a reducing atmosphere and having a thermal pinch action which envelops the gap between the tip and the electrode at the time of the application of the electrical potential which causes the discharge with a positive polarity being applied to the tip and a negative polarity applied to the electrode, said reducing atmosphere being chosen from the group of gases consisting of $H_2$, CO, $N_2O$ or $CH_4$ and said thermal pinch action atmosphere being chosen from the group of gases consisting of $H_2$, He, $CH_4$, $N_2$, or CO.

30. A method for forming a ball at the free tip of a metallic wire having a longitudinal axis by an electrical discharge comprising:

positioning the tip of the wire at a position displaced from the electrode by a gap across which a discharge can be produced by the application of an electrical potential of a magnitude sufficient to cause the discharge; and spraying a dry reducing gas having a thermal pinch action at the tip of the wire at least at the time of the electrical discharge in a direction along the longitudinal axis to increase the sphericity of the ball, said reducing gas atmosphere being chosen from the group of gases consisting of $H_2$, CO, $N_2O$ or $CH_4$ and said thermal pinch action atmosphere being chosen from the group of gases consisting of $H_2$, He, $CH_4$, $N_2$ or CO.

31. A method for forming a ball at the free tip of a metallic wire by an electrical discharge, as recited in claim 30, further comprising:

applying a relatively positive potential to the tip of the wire and a relatively negative potential to the electrode at the time of the electrical discharge.

* * * * *